(12) United States Patent
Mulfinger et al.

(10) Patent No.: US 10,680,065 B2
(45) Date of Patent: Jun. 9, 2020

(54) FIELD-EFFECT TRANSISTORS WITH A GROWN SILICON-GERMANIUM CHANNEL

(71) Applicant: GLOBALFOUNDRIES Inc., Grand Cayman (KY)

(72) Inventors: George R. Mulfinger, Gansevoort, NY (US); Timothy J. McArdle, Ballston Lake, NY (US); Jody Fronheiser, Delmar, NY (US); El Mehdi Bazizi, Saratoga Springs, NY (US); Yi Qi, Niskayuna, NY (US)

(73) Assignee: GLOBALFOUNDRIES INC.

( * ) Notice: Subject to any disclaimer, the term of this patent is extended or adjusted under 35 U.S.C. 154(b) by 0 days.

(21) Appl. No.: 16/052,140

(22) Filed: Aug. 1, 2018

(65) Prior Publication Data
US 2020/0044029 A1    Feb. 6, 2020

(51) Int. Cl.
*H01L 29/10* (2006.01)
*H01L 29/08* (2006.01)
(Continued)

(52) U.S. Cl.
CPC .... *H01L 29/1033* (2013.01); *H01L 21/02532* (2013.01); *H01L 21/02598* (2013.01); *H01L 21/3065* (2013.01); *H01L 21/3081* (2013.01); *H01L 21/30604* (2013.01); *H01L 21/84* (2013.01); *H01L 27/1203* (2013.01); *H01L 29/0847* (2013.01); *H01L 29/165* (2013.01); *H01L 21/0274* (2013.01); *H01L 21/02636* (2013.01); *H01L 21/3086* (2013.01); *H01L 29/1054* (2013.01); *H01L 29/78687* (2013.01)

(58) Field of Classification Search
CPC ............. H01L 29/1033; H01L 29/0847; H01L 29/165; H01L 21/02532; H01L 21/02598; H01L 21/30604; H01L 21/3065; H01L 21/3081; H01L 21/84; H01L 27/1203; H01L 29/1054; H01L 29/78687
See application file for complete search history.

(56) References Cited

U.S. PATENT DOCUMENTS

| 5,461,250 A | * | 10/1995 | Burghartz | ......... H01L 29/66742 257/192 |
| 6,399,970 B2 | * | 6/2002 | Kubo | ................... H01L 21/8238 257/192 |

(Continued)

OTHER PUBLICATIONS

PMOS Hole Mobility Enhancement Through SiGe Conductive Channel and Highly Compressive ILD-SiNx Stressing Layer, 2008 (Year: 2008).*

(Continued)

*Primary Examiner* — Patricia D Reddington
(74) *Attorney, Agent, or Firm* — Thompson Hine LLP

(57) ABSTRACT

Device structures for a field-effect transistor and methods of forming a device structure for a field-effect transistor. A channel region is arranged laterally between a first source/drain region and a second source/drain region. The channel region includes a first semiconductor layer and a second semiconductor layer arranged over the first semiconductor layer. A gate structure is arranged over the second semiconductor layer of the channel region The first semiconductor layer is composed of a first semiconductor material having a first carrier mobility. The second semiconductor layer is composed of a second semiconductor material having a second carrier mobility that is greater than the first carrier mobility of the first semiconductor layer.

8 Claims, 3 Drawing Sheets

(51) Int. Cl.
  *H01L 27/12*   (2006.01)
  *H01L 29/165*  (2006.01)
  *H01L 21/84*   (2006.01)
  *H01L 21/02*   (2006.01)
  *H01L 21/308*  (2006.01)
  *H01L 21/306*  (2006.01)
  *H01L 21/3065* (2006.01)
  H01L 21/027   (2006.01)
  H01L 29/786   (2006.01)

(56) References Cited

U.S. PATENT DOCUMENTS

| | | |
|---|---|---|
| 7,002,207 B2 | 2/2006 | Kim et al. |
| 7,205,586 B2 | 4/2007 | Takagi et al. |
| 7,282,402 B2 | 10/2007 | Sadaka et al. |
| 8,828,851 B2 | 9/2014 | Loubet et al. |
| 2011/0108943 A1* | 5/2011 | Dennard ........... H01L 21/76254 257/506 |
| 2018/0001293 A1 | 1/2018 | Kufeld et al. |

OTHER PUBLICATIONS

Liao et al., "PMOS Hole Mobility Enhancement Through SiGe Conductive Channel and Highly Compressive ILD-SiNx Stressing Layer", IEEE Electron Device Letters, vol. 29, No. 1, Jan. 2008.
Shi et al., "Mobility Enhancement in Surface Channel SiGe PMOSFETs With HfO2 Gate Dielectrics", IEEE Electron Device Letters, vol. 24, No. 1, Jan. 2003.

\* cited by examiner

FIELD-EFFECT TRANSISTORS WITH A GROWN SILICON-GERMANIUM CHANNEL

BACKGROUND

The invention relates generally to integrated circuits and, in particular, to device structures for a field-effect transistor and methods of forming a device structure for a field-effect transistor.

Complementary-metal-oxide-semiconductor processes may be used to build a combination of p-type and n-type field-effect transistors that are used to construct logic gates and as active components in other types of circuits, such as switches used in radiofrequency circuits. Device structures for a field-effect transistor generally include a source, a drain, and a gate electrode configured to switch carrier flow in a channel region arranged between the source and drain. When a control voltage exceeding a designated threshold voltage is applied to the gate electrode, carrier flow occurs in the channel region to produce a device output current.

A silicon-on-insulator substrate permits device operation at significantly higher speeds with improved electrical isolation and reduced electrical losses in comparison with field-effect transistors built using a bulk silicon wafer. Generally, a silicon-on-insulator substrate includes a thin device layer of semiconductor material, a substrate, and a buried oxide layer physically separating and electrically isolating the device layer from the substrate. Contingent on the thickness of the device layer, a field-effect transistor may operate in a fully-depleted mode in which a depletion layer in the channel region extends fully to the buried oxide layer when typical control voltages are applied to the gate electrode.

The channel region of a fully-depleted p-type field-effect transistor may be composed of silicon-germanium. A conventional approach for forming the silicon-germanium channel region is to grow an epitaxial silicon-germanium layer on a section of the device layer and to perform a thermal condensation process. Germanium is transported from the epitaxial silicon-germanium layer to the device layer and throughout the channel region down to the buried oxide layer. The silicon-germanium channel region formed by the thermal condensation process may be prone to strain relaxation and broken bonds at an interface with the buried oxide layer. The broken bonds may elevate the interface trap density at the interface, and the strain relaxation may impact device performance through a loss of carrier mobility.

Improved device structures for a field-effect transistor and methods of forming a device structure for a field-effect transistor are needed.

SUMMARY

In an embodiment of the invention, a device structure is provided for a field-effect transistor. The device structure includes a first source/drain region, a second source/drain region, and a channel region arranged laterally between the first source/drain region and the second source/drain region. The channel region includes a first semiconductor layer and a second semiconductor layer arranged over the first semiconductor layer. A gate structure is arranged over the second semiconductor layer of the channel region. The first semiconductor layer is composed of a first semiconductor material having a first carrier mobility. The second semiconductor layer is composed of a second semiconductor material having a second carrier mobility that is greater than the first carrier mobility of the first semiconductor layer.

In an embodiment of the invention, a method is provided for forming a device structure for a field-effect transistor. The method includes thinning a device layer of a silicon-on-insulator substrate in a first device area to form a first semiconductor layer of a channel region, epitaxially growing a second semiconductor layer of the channel region on the first semiconductor layer, forming a gate structure over the second semiconductor layer, and forming a first source/drain region and a second source/drain region separated from the first source/drain region by the channel region. The first semiconductor layer is composed of a first semiconductor material having a first carrier mobility. The second semiconductor layer is composed of a second semiconductor material having a second carrier mobility that is greater than the first carrier mobility of the first semiconductor layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
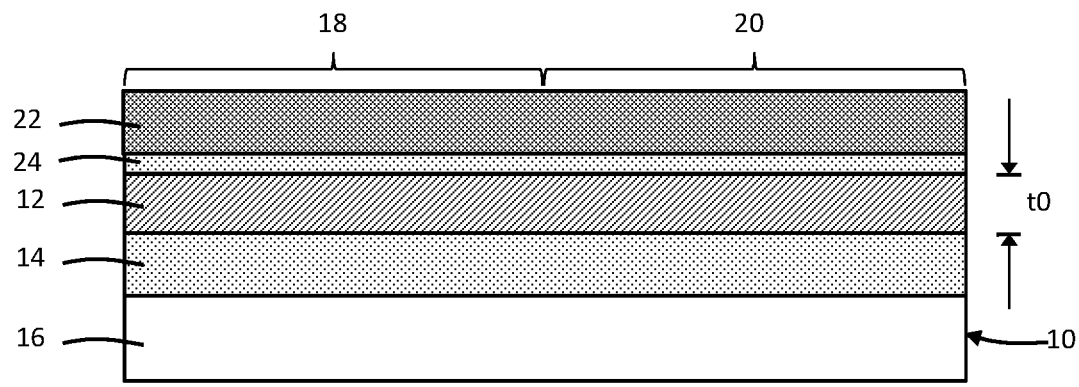
FIGS. 1-5 are cross-sectional views of a structure at successive fabrication stages of a process in accordance with embodiments of the invention.

With reference to FIG. 1 and in accordance with an embodiment of the invention, a silicon-on-insulator (SOI) substrate 10 includes a buried oxide layer 14 composed of an oxide of silicon (e.g., $SiO_2$), and a substrate 16. The device layer 12 is separated from the substrate 16 by the intervening buried oxide layer 14 and may be considerably thinner than the substrate 16. The device layer 12 and the substrate 16 may be composed of a single-crystal semiconductor material, such as single-crystal silicon. In an embodiment, the device layer 12 may have a thickness, t0, that is compatible with the fabrication of fully-depleted SOI devices (FDSOI). The buried oxide layer 14 direct contacts the substrate 16 along an interface and directly contacts with the device layer 12 along another interface, and these interfaces are separated by the thickness of the buried oxide layer 14 and terminate at the outer rim of the SOI substrate 10. The device layer 12 is electrically isolated from the substrate 16 by the buried oxide layer 14. The substrate 16 may be lightly doped to have, for example, p-type conductivity.

The SOI substrate 10 and device layer 12 may be considered to include a device area 18 and a device area 20. The different device areas 18, 20 may be used in the process flow to fabricate field-effect transistors characterized by different conductivity types, and are eventually electrically isolated from each other. The device areas 18, 20 may be implanted to provide p-wells and n-wells (not shown) that may be needed for subsequent device fabrication.

A hardmask layer 22 and a pad layer 24 are formed in a layer stack over the device layer 12. The hardmask layer 22 may be composed of a dielectric material, such as silicon nitride ($Si_3N_4$), deposited by chemical vapor deposition (CVD). The pad layer 24 may be composed of a dielectric material, such as silicon dioxide ($SiO_2$), deposited by chemical vapor deposition.

Figure 2:
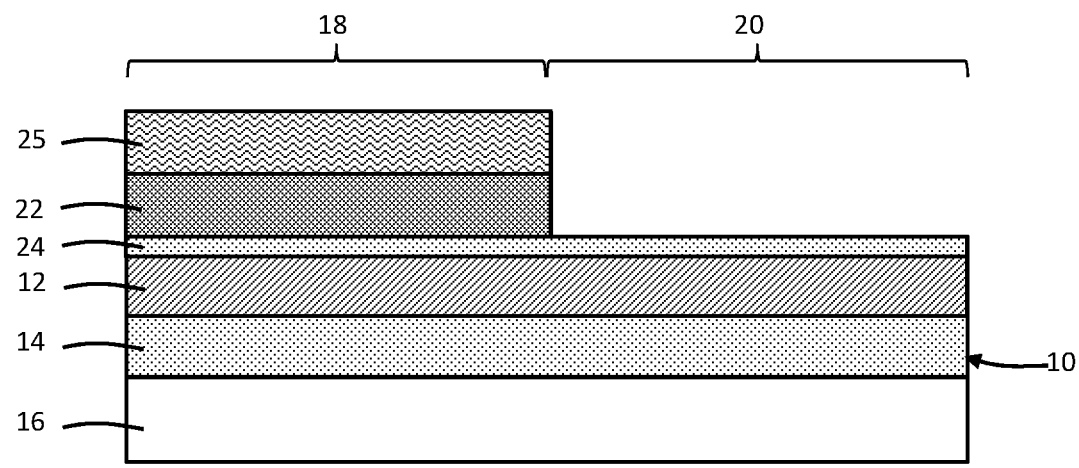

With reference to FIG. 2 in which like reference numerals refer to like features in FIG. 1 and at a subsequent fabrication stage, the hardmask layer 22 is removed from the device area 20 to expose the pad layer 24 over the underlying device layer 12. To that end, an etch mask 25 is formed by lithography over the device layer 12. The etch mask 25 completely covers the hardmask layer 22 in device area 18. The etch mask 25 may include layer of a photosensitive material, such as an organic photoresist, that may be applied as a fluid by a spin coating process, pre-baked, exposed to light projected through a photomask, baked after exposure, and developed with a chemical developer. The exposed portion of the hardmask layer 22 may be removed from the device layer 12 in device area 20 using an etching process, such as a reactive ion etching process, that removes the hardmask layer 22 selective to the pad layer 24. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The hardmask layer 22 in device area 18 is protected by the etch mask 25 during the etching process. The etch mask 25 is stripped following the completion of the etching process.

Figure 3:
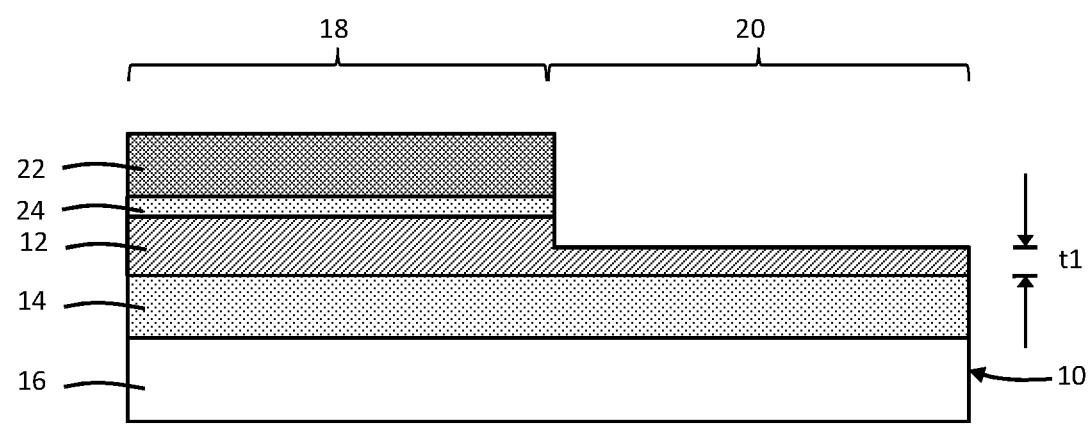

With reference to FIG. 3 in which like reference numerals refer to like features in FIG. 2 and at a subsequent fabrication stage, the pad layer 24 is removed from the device layer 12 in device area 20 by an etching process, such as a wet chemical etching process using a hydrofluoric acid solution, and the device layer 12 in device area 20 is thinned. For example, the device layer 12 may be thinned by oxidizing a partial thickness of the device layer 12 with, for example, a rapid thermal oxidation process, and removing the oxide with an etching process, such as a wet chemical etching process using a hydrofluoric acid solution. After the thinning, the device layer 12 in device area 20 may have a thickness, t1, that is less than the original thickness, t0, of the device layer 12. Because the device layer 12 in device area 18 is masked by the pad layer 24 and not thinned, the thickness of the device layer 12 in device area 18 is greater than the thickness of the device layer 12 in device area 20.

Figure 4:
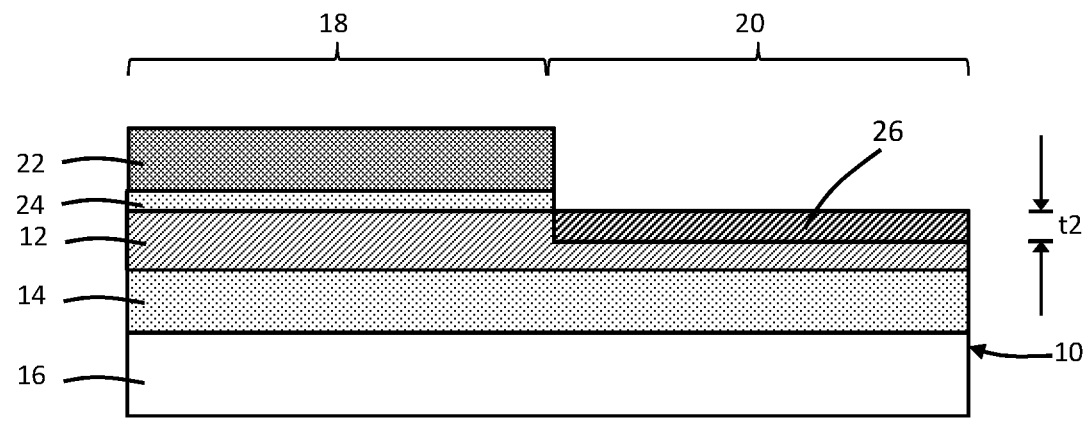

With reference to FIG. 4 in which like reference numerals refer to like features in FIG. 3 and at a subsequent fabrication stage, an epitaxial semiconductor layer 26 is formed over the exposed section of the device layer 12 in device area 20. The epitaxial semiconductor layer 26 may be in direct contact with the exposed section of the device layer 12, which provides the crystal structure serving as a template for epitaxial growth. In an embodiment, the epitaxial semiconductor layer 26 may contain germanium (Ge) and, in particular, the epitaxial semiconductor layer 26 may be composed of silicon-germanium (SiGe) that is epitaxially grown by a deposition process and that may have a germanium concentration (i.e., the ratio of the germanium content to the germanium and silicon content) ranging from 2% to 50%. The epitaxial semiconductor layer 26 may be formed using an epitaxial growth process, such as a selective epitaxial growth process in which the constituent semiconductor material nucleates for epitaxial growth from semiconductor surfaces, but does not nucleate for epitaxial growth from insulator surfaces (e.g., the top surface of the hardmask layer 22 over device area 18).

The epitaxial semiconductor layer 26 may have a thickness, t2. In an embodiment, the sum of the thickness of the thinned device layer 12 and the thickness of the epitaxial semiconductor layer 26 in device area 20 may be equal to the thickness of the device layer 12 in device area 18. In an embodiment, the summed thicknesses of the thinned device layer 12 and epitaxial semiconductor layer 26 in device area 20 may be less than or equal to six (6) nanometers (nm). The semiconductor material of the epitaxial semiconductor layer 26 may have a carrier mobility that is greater than the carrier mobility of the semiconductor material of the device layer 12.

The epitaxial semiconductor layer 26 may incorporate compressive strain into its crystal structure. Generally, the lattice constant of the semiconductor material (e.g., silicon-germanium) of the epitaxial semiconductor layer 26 is slightly larger than the lattice constant of the semiconductor material (e.g., silicon without added germanium) in the underlying device layer 12. The compressive strain may be effective to alter carrier mobility in a transistor channel region formed using the epitaxial semiconductor layer 26.

Figure 5:
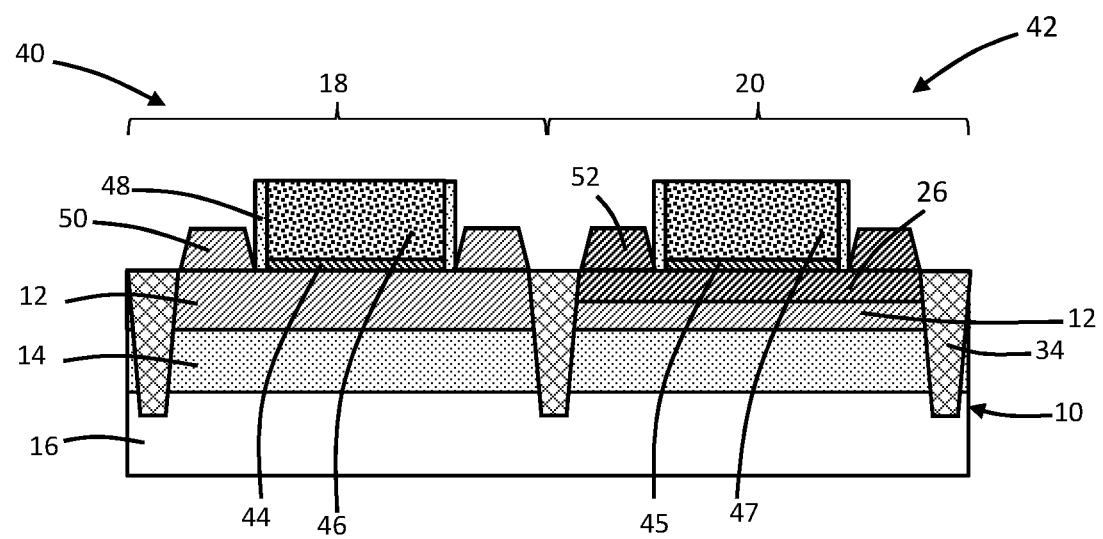

With reference to FIG. 5 in which like reference numerals refer to like features in FIG. 4 and at a subsequent fabrication stage, the remainder of the hardmask layer 22 is removed from the device area 18 using a wet chemical process, such as a heated phosphoric acid solution, to expose the pad layer 24. The exposed pad layer 24 is removed from the device area 18 using a wet chemical process, such as a heated hydrofluoric acid solution, to expose the device layer 12 in device area 18.

Trench isolation regions 34 are formed that penetrate through the device layer 12 and the buried oxide layer 14, and extend to a given depth into the substrate 16. The trench isolation regions 34 may surround the device layer 12 in device area 18, and the trench isolation regions 34 also surround the composite structure (i.e., layer stack) including the epitaxial semiconductor layer 26 and thinned device layer 12 in device area 20. The trench isolation regions 34 may be formed by a shallow trench isolation (STI) technique in which trenches are formed and then filled by depositing dielectric material and then polishing and/or recessing the deposited dielectric material and annealing. The trench isolation regions 34 may be composed of one or more dielectric materials, such as an oxide of silicon (e.g., silicon dioxide ($SiO_2$)) and/or a nitride of silicon (e.g., silicon nitride ($Si_3N_4$)), deposited by chemical vapor deposition or atomic layer deposition. The maximum substrate temperature used to anneal the trench isolation regions 34 may be controlled to prevent mixing of the epitaxial semiconductor layer 26 and the device layer 12. The maximum substrate temperature may be less than or equal to 800° C.

A device structure 40 for a field-effect transistor is formed by front-end-of-line processing in the device area 18, and a device structure 42 for a field-effect transistor is formed by front-end-of-line processing in the device area 20. To that end, a dielectric layer and one or more conductor layers may be deposited and patterned to form a gate dielectric 44 and gate electrode 46 of a gate structure associated with the device structure 40 and to form a gate dielectric 45 and gate electrode 47 of a gate structure associated with the device structure 42. The gate dielectrics 44, 45 may be composed of a dielectric material, such as hafnium oxide ($HfO_2$), and the gate electrodes 46, 47 may be composed of one or more conformal barrier metal layers and/or work function metal layers. The one or more conformal barrier metal layers and/or work function metal layers of the gate electrode 46 may differ from the one or more conformal barrier metal layers and/or work function metal layers of the gate electrode 47. Spacers 48 may be formed at the vertical sidewalls of the gate structures.

Source/drain regions 50 are formed adjacent to the vertical sidewalls of the gate structure of the device structure 40 and are separated from the gate structure by the spacers 48. Source/drain regions 52 are also formed adjacent to the vertical sidewalls of the gate structure of the device structure 42 and are separated from the gate structure by the spacers 48. As used herein, the term "source/drain region" means a doped region of semiconductor material that can function as either a source or a drain of a field-effect transistor. In an embodiment, the device structure 40 may be an n-type field-effect transistor and the device structure 42 may be a p-type field-effect transistor. The source/drain regions 50 may be composed of a semiconductor material, such as silicon (Si), formed by an epitaxial growth process, and may be in situ doped during growth to provide a given conductivity type (e.g., n-type conductivity for an n-type field-effect transistor). The source/drain regions 52 are composed of a semiconductor material, such as silicon germanium (SiGe), formed by an epitaxial growth process, and may be in situ doped during growth to provide a given conductivity type (e.g., p-type conductivity for a p-type field-effect transistor).

The device structure 42 has a hybrid or composite channel region that includes the epitaxial semiconductor layer 26 and the underlying thinned section of the device layer 12 as vertically-adjoining sections of different composition with the epitaxial semiconductor layer 26 arranged over the thinned section of the device layer 12. The composite channel region is arranged beneath the gate dielectric 45 and gate electrode 47 of the device structure 42, and the composite channel region is arranged laterally between the source/drain regions 52. In the representative embodiment, the source/drain regions 52 are raised relative to the composite channel region. The device structure 40 has a channel region that is composed of the semiconductor material (e.g., silicon) of the device layer 12.

Middle-of-line (MOL) processing and back-end-of-line (BEOL) processing follows the fabrication of the device structures 40, 42, which includes formation of dielectric layers, vias, contacts, and wiring for an interconnect structure coupled with the device structures 40, 42.

The composite channel region of the device structure 42 is formed without reliance upon a thermal condensation process (i.e., uncondensed). A thinned section of the device layer 12 is arranged in a vertical direction between the epitaxial semiconductor layer 26 and the buried oxide layer 14 in device area 20. The semiconductor material (e.g., silicon-germanium) of the epitaxial semiconductor layer 26 is less prone to strain relaxation because of the intervening thinned section of the device layer 12. In addition, broken bonds are absent at an interface between the composite channel region and the buried oxide layer 14 because the semiconductor material (e.g., silicon) of the device layer 12, rather than the semiconductor material (e.g., silicon-germanium) of the epitaxial semiconductor layer 26, directly contacts the buried oxide layer 14. The result is a reduction in interface traps, which may improve the performance of the device structure 42. Moreover, the epitaxial semiconductor material constituting the source/drain regions 52 may have a reduced susceptibility to the formation of agglomeration defects.

Figure 6:
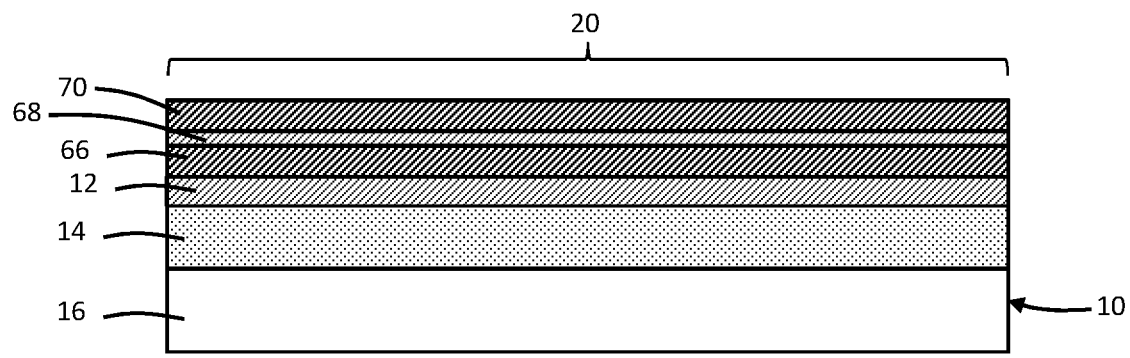
FIGS. 6-7 are cross-sectional views of a structure at successive fabrication stages of a process in accordance with embodiments of the invention.

With reference to FIG. 6 in which like reference numerals refer to like features in FIG. 3 and in accordance with alternative embodiments of the invention, the device area 20 may be processed to form two different types of device structures 42 each having a composite channel. Specifically, after the device layer 12 in device area 20 is thinned, multiple epitaxial semiconductor layers 66, 68, 70 are formed in a layer stack over the thinned device layer 12 in device area 20. The epitaxial semiconductor layers 66, 68, 70 may be formed using an epitaxial growth process, such as a selective epitaxial growth process. The bottom epitaxial semiconductor layer 66 may be in direct contact with the device layer 12 in device area 20, which provides the crystal structure serving as a template for epitaxial growth of the epitaxial semiconductor layers 66, 68, 70.

In an embodiment, the epitaxial semiconductor layer 66 and the epitaxial semiconductor layer 70 may contain germanium (Ge). In particular, the epitaxial semiconductor layers 66, 70 may be composed of silicon-germanium (SiGe) that is epitaxially grown and that may have a germanium concentration (i.e., the ratio of the germanium content to the germanium and silicon content) ranging from 2% to 50%. The epitaxial semiconductor layer 68 may be composed of a different semiconductor material lacking germanium, such as silicon (Si), that is epitaxially grown. During the epitaxial growth process, the supply of germanium may be discontinued during the formation of the epitaxial semiconductor layer 68 to provide the layer stack.

Figure 7:
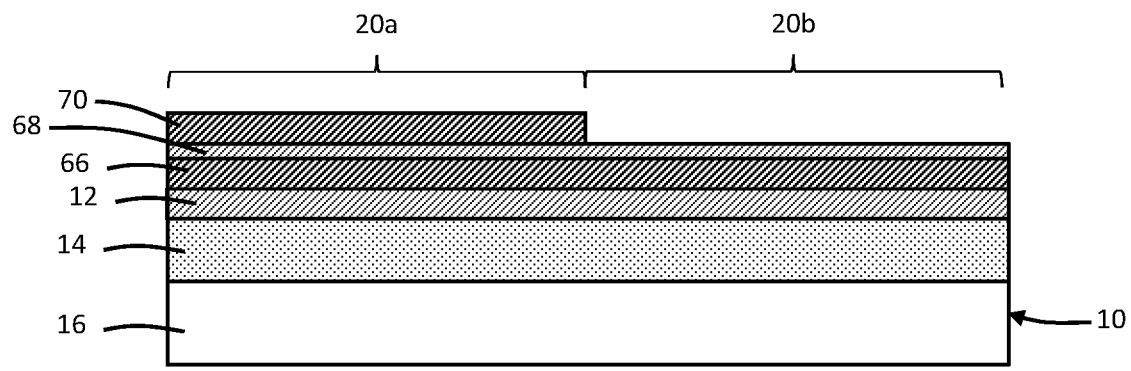

With reference to FIG. 7 in which like reference numerals refer to like features in FIG. 6 and at a subsequent fabrication stage, the topmost epitaxial semiconductor layer 70 may be removed over a portion of the device area 20 by a lithography and etching process. The etching process, which may be a wet chemical etching process using a hydrochloric acid solution, may remove the semiconductor material of the topmost epitaxial semiconductor layer 70 selective to the semiconductor material of the middle epitaxial semiconductor layer 68 such that the epitaxial semiconductor layer 68 operates as an etch stop. The device area 20 is divided by the patterning into multiple device areas 20a, 20b in which only device area 20a includes a section of the topmost epitaxial semiconductor layer 70.

The process flow continues as described in the context of FIGS. 5 and 6 to form a device structure 42 in the device area 20a and a separate device structure 42 in the device area 20b. The composite channel region of the device structure 42 formed in the device area 20a is thicker than the composite channel region of the device structure 42 formed in the device area 20b. The composite channel region of the device structure 42 formed in the device area 20a is capped by the semiconductor material (e.g., silicon-germanium) of the epitaxial semiconductor layer 70. The composite channel region of the device structure 42 formed in the device area 20b is capped by the semiconductor material (e.g., silicon) of the epitaxial semiconductor layer 68. In an embodiment, the device structure 42 formed in the device area 20a may be a high-voltage input/output field-effect transistor, and the device structure 42 formed in the device area 20b may be a core logic field-effect transistor.

The thicker composite channel in device area 20a may provide the device structure 42 in device area 20a with improved hot carrier injection (HCI) reliability that may be required to support higher voltages compared to the device structure 42 in device area 20b characterized by the thinner composite channel. The raised source/drain regions of the device structures 42 formed in the device areas 20a, 20b may have a reduced susceptibility to agglomeration defects typically formed during the epitaxial growth of the source/drain regions 52. The gate dielectric is deposited on the semiconductor material (e.g., silicon) of the epitaxial semiconductor layer 68 in device area 20b, which may improve carrier mobility and/or reduce the number of traps.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure for a field-effect transistor, the device structure comprising:
   a first source/drain region;
   a second source/drain region;
   a channel region arranged laterally between the first source/drain region and the second source/drain region, the channel region including a first semiconductor layer and a second semiconductor layer arranged over the first semiconductor layer, the first semiconductor layer is comprised of single-crystal silicon, and the second semiconductor layer is comprised of single-crystal silicon-germanium; and
   a gate structure arranged over the second semiconductor layer of the channel region, the gate structure including a gate dielectric arranged in a directly contacting relationship with the second semiconductor layer and a gate electrode over the gate dielectric.

2. The device structure of claim 1 wherein the first semiconductor layer is a device layer of a silicon-on-insulator substrate, and the second semiconductor layer has an epitaxial relationship with a crystal structure of the first semiconductor layer.

3. The device structure of claim 2 wherein the first semiconductor layer is arranged in direct contact with a buried oxide layer of the silicon-on-insulator substrate.

4. The device structure of claim 2 wherein the field-effect transistor is formed in a first device area of the silicon-on-insulator substrate, the device layer has a first thickness in the first device area, and the device layer has a second thickness in a second device area of the silicon-on-insulator substrate that is greater than the first thickness.

5. The device structure of claim 1 wherein the second first semiconductor layer has a first thickness, the second semiconductor layer has a second thickness, and a sum of the first thickness of the first semiconductor layer and the second thickness of the second semiconductor layer is less than or equal to six nanometers.

6. The device structure of claim 1 wherein the first source/drain region and the second source/drain region are comprised of p-type silicon-germanium.

7. A device structure comprising:
   a first field effect transistor including a first source/drain region, a second source/drain region, a first gate structure, and a first channel region arranged laterally between the first source/drain region and the second source/drain region, the first channel region including a first semiconductor layer, a second semiconductor layer arranged over the first semiconductor layer, a third semiconductor layer arranged over the second semiconductor layer, and a fourth semiconductor layer arranged over the third semiconductor layer, the first semiconductor layer is comprised of single-crystal silicon, the first semiconductor layer and the third semiconductor layer are comprised of single-crystal silicon, and the second semiconductor layer and the fourth semiconductor layer are comprised of single-crystal silicon-germanium,
   wherein the first gate structure is arranged over the fourth semiconductor layer of the first channel region, and the first gate structure includes a first gate dielectric arranged in a directly contacting relationship with the fourth semiconductor layer and a first gate electrode over the first gate dielectric.

8. The device structure of claim 7 wherein the first channel region of the first field-effect transistor includes a first section of the first semiconductor layer, a first section of the second semiconductor layer, a first section of the third semiconductor layer, and a first section of the fourth semiconductor layer, and further comprising:
   a second field-effect transistor including a second channel region and a second gate structure, the second channel region including a second section of the first semiconductor layer, a second section of the second semiconductor layer arranged over the second section of the first semiconductor layer, and a second section of the third semiconductor layer arranged over the second section of the second semiconductor layer,
   wherein the second gate structure is arranged over the second section of the third semiconductor layer of the second channel region, and the second gate structure includes a second gate dielectric arranged in a directly contacting relationship with the second section of the third semiconductor layer and a second gate electrode over the second gate dielectric.

* * * * *